United States Patent [19]
McElroy

[11] 4,208,726
[45] Jun. 17, 1980

[54] PROGRAMMING OF SEMICONDUCTOR READ ONLY MEMORY

[75] Inventor: David J. McElroy, Houston, Tex.
[73] Assignee: Texas Instruments Incorporated, Dallas, Tex.
[21] Appl. No.: 914,644
[22] Filed: Jun. 12, 1978
[51] Int. Cl.$^2$ .......................................... G11C 17/00
[52] U.S. Cl. ............................................... 365/104
[58] Field of Search ............. 365/94, 104; 340/166 R

[56] References Cited

U.S. PATENT DOCUMENTS 3,618,050  11/1971  Heeren ................................. 365/104

OTHER PUBLICATIONS

Baitinger et al., IGFET Read-Only Memory, IBM Tech. Disc. Bul., vol. 14, No. 5, 10/71, pp. 1429-1430.
Chu et al., Conversion of Read/Write Memory to Read-Only Memory, IBM Tech. Disc. Bul., vol. 17, No. 9, 2/75, pp. 2586-2587.
Platt, Read/Write to Read-Only Memory Conversion, IBM Tech. Disc. Bul., vol. 17, No. 12, 5/75, p.3543.
Balasubramanian et al., Two Device Per Bit, Pre-charged ROS with Differential Sensing, IBM Tech. Disc. Bul., vol. 19, No. 1, 6/76.

*Primary Examiner*—Stuart N. Hecker
*Attorney, Agent, or Firm*—John G. Graham

[57] ABSTRACT

A semiconductor integrated circuit is shown in the form of an MOS read only memory or ROM formed by standard N-channel silicon gate manufacturing methods. Address lines and gates are polysilicon strips, output lines are metal strips, and ground lines are defined by elongated N+ regions. Each potential MOS transistor in the array is programmed to be a logic "1" or "0", by the presence or absence of a contact between an output metal line and an N+ drain region of a transistor, or by the presence or absence of a moat forming the transistor of the cell. In moat programming, if both cells in a pair are programmed as zeros, then both contact and moat are eliminated, thus reducing capacitive loading and increasing speed. In contact programming, the moat can be removed for inactive bits to reduce loading.

10 Claims, 13 Drawing Figures

PROGRAMMING OF SEMICONDUCTOR READ ONLY MEMORY

BACKGROUND OF THE INVENTION

This invention relates to semiconductor memory devices, and more particularly to N-channel silicon gate MOS read only memories and methods for programming.

Storage of fixed programs in digital equipment such as microcomputers and microprocessor systems is usually provided by MOS read only memory devices or "ROMs". ROMs are made by semiconductor manufacturers on special order, the programming code being specified by the customer. The economics of manufacture of ROMs, and of mounting them on circuit boards in the system, are such that the number of memory bits per semiconductor chip is advantageously as high as possible. ROMs of up to 32K bits (32768) are typical at present. Within a few years, standard sizes will progress through 64K, 128K and 1 megabit. This dictates that cell size for the storage cells of the ROM be quite small. Metal gate ROMs of small size can be relatively easily fabricated in the manner set forth in U.S. Pat. Nos. 3,541,543, and 4,061,506, assigned to Texas Instruments. Most microprocessor and computer parts are now made by the N-channel silicon gate process because of the shorter access times provided. In the past, ROMs made by the N-channel process have been programmed by the moat mask or by contacts between output metal lines and N+ drain regions. N-channel ROMs are disclosed in prior applications Ser. No. 762,612, now U.S. Pat. No. 4,151,020, filed Jan. 29, 1977 and Ser. No. 701,932 now abandoned, filed July 1, 1976 and Ser. No. 907,235, filed May 18, 1978 assigned to Texas Instruments. A method of programming a ROM by ion implant prior to forming the polysilicon gate is shown in U.S. Pat. No. 4,059,826 to Gerald D. Rogers, assigned to Texas Instruments. Methods of programming N-channel ROMs by implant through polysilicon gates are shown in copending applications Ser. Nos. 890,555, 890,556, and 890,557, filed Mar. 20, 1978, and 907,236, filed May 18, 1978, assigned to Texas Instruments. These methods required that no metal overlie the gates so "SATO" type processing was used so that no metal was in the ROM array, or otherwise used processing different from the standard "NSAG" which is in large volume use.

In these and other prior methods of programming, capacitance between the X address lines and the output, substrate or ground, or between the output lines and the substrate or ground, was not minimized. Such capacitance adds to delays in the access time or cycle time. When cells are programmed "zero", i.e., the potential transistors not programmed in, needless capacitance is nevertheless introduced. In very large arrays with 256, 512 or 1024 cells on a single line, the capacitance can be very detrimental.

It is the principal object of this invention to provide a semi-conductor permanent store memory programmed in a manner which reduces unwanted capacitance, yet still uses the standard high volume N-channel process. Another object is to provide a semiconductor ROM which is made by the standard N-channel self-aligned silicon gate manufacturing process and is programmable to remove the capacitance of cells which contain "unrealized" transistors.

SUMMARY OF THE INVENTION

In accordance with an embodiment of the invention, a metal-oxide-semiconductor read only memory, or MOS ROM, is formed in an integrated circuit. The ROM is an array of potential MOS transistors where polysilicon strips on a silicon bar define the X address lines and gates, and output lines are metal strips overlying the poly gates, perpendicular to the X address lines. In the array, each potential MOS transistor is a storage cell, each cell being programmed to store a logic "1" or "0" by one of two methods. In moat programming, the moat in the channel area is programmed to be present or absent at the time of the photoresist operation using the moat mask; in this case the contact to the drains of a cell pair is also programmed out if both cells are zeros, reducing capacitance. For contact programming, the moat can be also removed from inactive bits in volume production to reduce loading.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
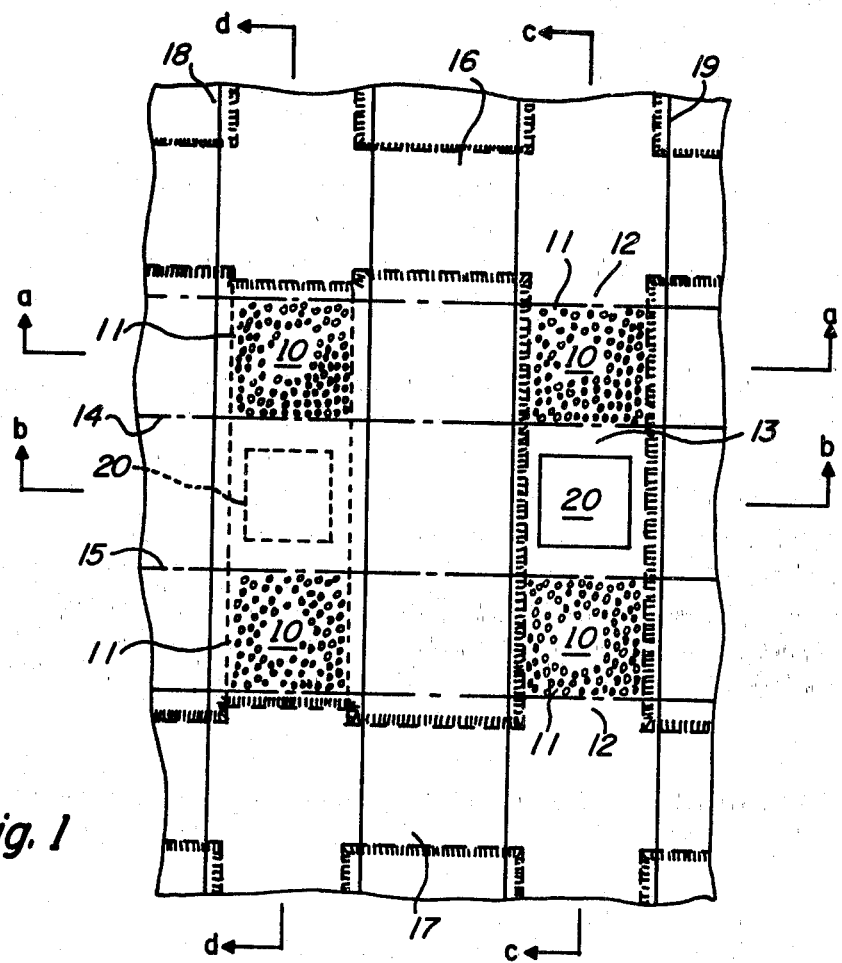
FIG. 1 is a greatly enlarged plan view of a small portion of a semiconductor chip showing the physical layout of a part of a ROM array made according to one embodiment of the invention.
Figure 2:
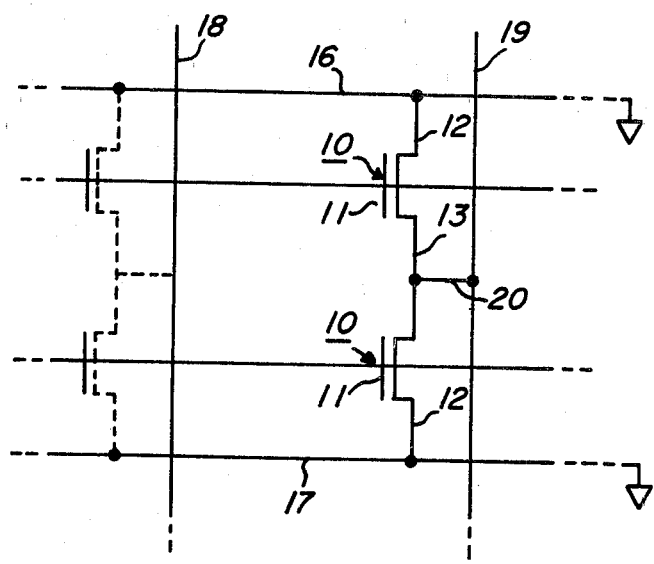
FIG. 2 is an electrical schematic diagram of the ROM of FIG. 1.
Figure 3A:
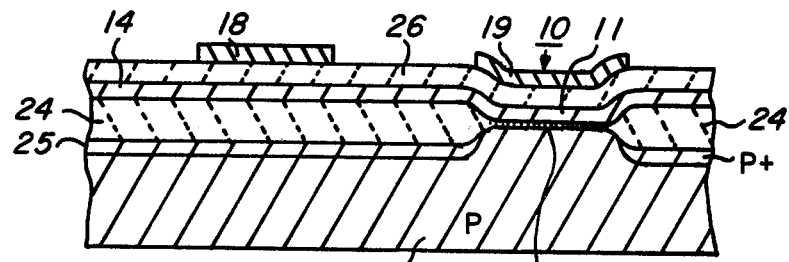
FIGS. 3a–3d are elevation views in section of the cell of FIG. 1, taken along the lines a—a, b—b, c—c, and d—d, respectively.
Figure 3B:
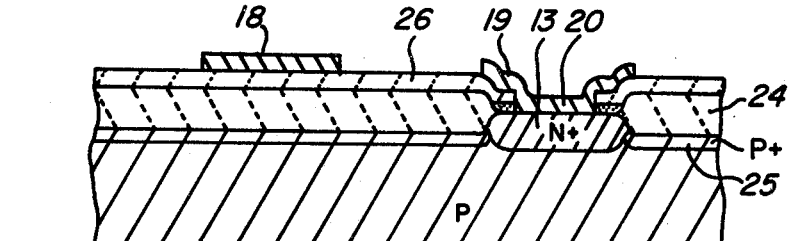
Figure 3C:
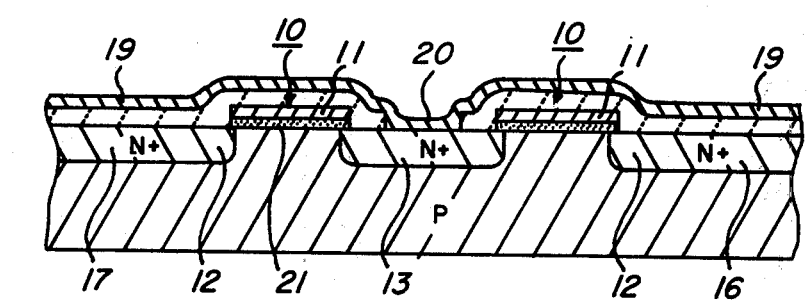
Figure 3D:
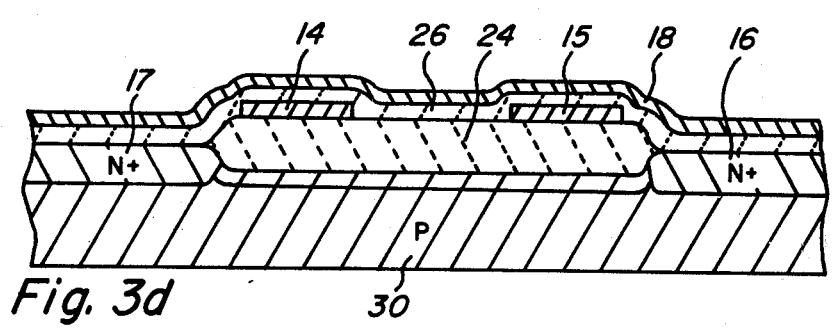

With reference to FIGS. 1, 2, and 3a–3d, a read only memory is illustrated which is programmed according to one embodiment of the invention. The array consists of a large number of cells 10, only four of which are shown. Each cell is an MOS transistor having a gate 11, a source 12 and a drain 13. The gates 11 are parts of polysilicon strips 14 and 15 which are the X address lines for the array. The sources are part of N+ diffused regions 16 and 17 which are connected to ground or Vss, while the drains are part of N+ diffused regions which are connected to metal Y output lines 18 and 19 at metal-to-moat contacts 20. The array, formed on a silicon bar, would typically contain perhaps 64K, 128K or 256K cells, so the bar would be less than about 200 mils on a side or 40,000 sq. mil area depending upon the bit density. The four cells 10 shown would be on a minute part of the bar, perhaps one or two mils wide. A 64K ROM would require 256 of the X address lines such as 14 and 15 and 256 of the Y lines like the lines 18 and 19, providing 65,536 bits.

The cell array is programmed by the presence or absence of moat areas beneath the gate areas 11. The mask which defines the moat area is thus the unique mask which defines the ROM code. If no moat is provided under a gate area 11, then a logic "1" voltage in the gate will not produce a channel beneath the thick field oxide which in this case will underlie the gate. In the example of four cells shown, the upper and lower left hand cells are programmed in this manner to be zero or inactive, the others on the right hand side are active or logic "1".

A thick field oxide coating 24 covers parts of the bar not occupied by the transistor sources, drains and gates, and the interconnects. P+ channel stop regions 25 are formed underneath all the thick field oxide. An interlevel oxide coating 26 is provided between the polysilicon strips 14, 15 and the metal strips 18 and 19.

A thick protective oxide layer (not shown) covers the metallization, with aperatures etched in this layer above bonding pads. This layer is non-thermal oxide deposited at low temperature in accord with standard MOS manufacturing methods. Usually this oxide covers everything except the bonding pads on a bar.

Turning now to FIGS. 4a-4d, a process for making the ROM array of the invention will be described. The starting material is a slice of P-type monocrystalline semiconductor grade silicon, typically 3 inches in diameter. In the FIGURES the portion shown of the bar 30 represents only a very small undivided part of the slice, perhaps one mil wide for each part. After appropriate cleaning, the slice is oxidized by exposing to oxygen in a tube furnace at an elevated temperature of perhaps 1000 degrees C. to produce an oxide layer 31 over the entire slice of a thickness of about 1000 Angstroms. Next, a layer 32 of silicon nitride of about 1000 Angstroms thickness is formed over the entire slice by exposing to an atmosphere of dichlorosilane and ammonia in a CVD reactor. A coating of photoresist is applied to the entire top surface of the slice, then exposed to ultraviolet light through a mask which defines the desired pattern of the thick field oxide 24 and the P+ channel stop 25. This is the programming mask which defines the unique code, i.e., the presence or absence of moat areas under the gates. The resist is developed, exposing areas where nitride is then etched away by a nitride etchant leaving in place the oxide layer 31.

Using photoresist and nitride as a mask, the slice is now subjected to a conventional ion implant step to produce the channel stop regions 25 whereby boron atoms are introduced into unmasked regions 33 of silicon. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

Figure 4A:
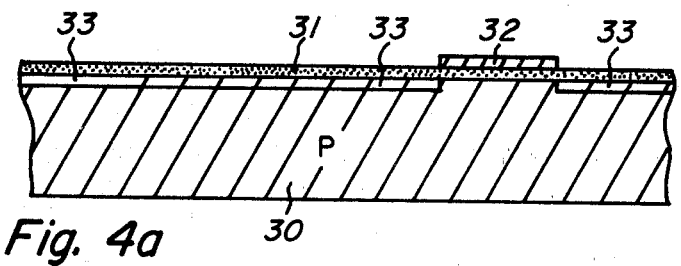
FIGS. 4a–4d are elevation views in section of the ROM array and a transistor in the peripheral part of the semiconductor device of FIGS. 1 and 3a–3d, at successive stages in the manufacturing process, taken generally along the line a—a in FIG. 1.
Figure 4B:
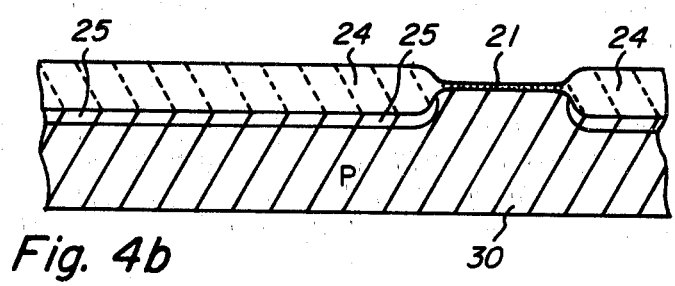

The next step in the process is formation of field oxide 24, which is done by subjecting the slices to steam or an oxidizing atmosphere at about 1000 degrees C. for perhaps several hours. This causes a thick field oxide region or layer 24 to be grown as seen in FIG. 4b. This region extends into the silicon surface because silicon is consumed as it oxidizes. The remaining parts of the nitride layer 32 mask oxidation. The thickness of this layer 24 is about 10,000 Angstroms, about half of which is above the original surface and half below. The boron doped P+ regions 33 formed by implant will be partly consumed, but will be much deeper than the original regions 33.

Next the remaining nitride layer 32 is removed by an etchant which attacks nitride but not silicon oxide, then the oxide 31 is removed by etching and the exposed silicon cleaned. The gate oxide 21 is grown by thermal oxidation to a thickness of about 500 to 800 Angstroms. In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for polysilicon to silicon contacts, if needed in the periphery, are patterned and etched at this point using photoresist; none are needed in the ROM array itself.

Figure 4C:
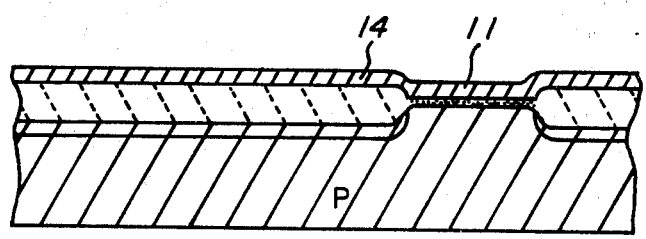
Figure 4D:
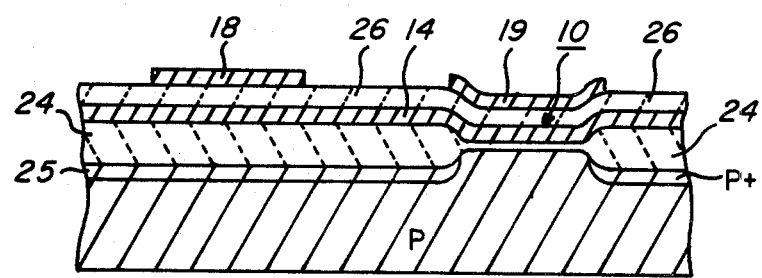

As seen in FIG. 4c a layer of polycrystalline silicon of about 0.5 micron thickness is deposited over the entire slice in reactor using standard techniques. This layer is doped with phosphorus by the later N+ diffusion to make it highly conductive. The polysilicon layer is patterned by applying a layer of photoresist, exposing to ultraviolet light through a mask prepared for this purpose, developing, then etching both polysilicon and exposed oxide. The remaining photoresist masks the gate areas and the lines 14 and 15, as well as the gates of peripheral transistors and interconnections in other parts of the circuit on the chip. The unmasked polycrystalline silicon is etched away, so the resulting structure seen in FIG. 4d includes a part of the remaining polysilicon layer which provides what will be the gates 11 in the ROM array, as well as the line 14. The thin oxide 21 underneath the right hand gate areas is the gate oxide of the transistor, while the left hand transistor area has thick oxide beneath it so it will be a "0". The ground lines 16 and 17 will be exposed, as will the sources and drains 12 and 13. The slice is next subjected to a standard N+ diffusion whereby the N+ regions are formed using the gate oxide 21 and the field oxide as a diffusion mask.

A layer 26 of silicon oxide is deposited by decomposition of silane at a low temperature, about 400 degrees C. This layer insulates the metal level from the polycrystalline silicon interconnections and gates and is referred to as multilevel oxide. The multilevel oxide layer 26 is now patterned by a photoresist operation, exposing contact areas 20 for a metal-to-silicon contact in the ROM array, as well as contact areas for metal contacts and interconnections used in the periphery of the chip in the input buffers, decoders, sense amplifiers, substrate pump, and the like.

Up to this point in the process the slices are the same as in moat programming. There will be a large number of transistor pairs in the ROM array where both transistors are inactive with no functioning gate or channel. The left hand pair is an example. Statistically, this will occur in 25% of the transistor pairs. For these inactive pairs, no contact area 20 is offered at this point so no metal-to-silicon contact 20 is made. This eliminates the capacitance from the drain 13 to the substrate 30 from being added to the line 18, speeding up the operation.

The metal contacts and interconnections are made in the usual manner by depositing a thin film of aluminum over the entire top surface of the slice then patterning it by a photoresist mask and etch sequence. This leaves metal strips 18 and 19 which are the Y output lines.

Contact areas 20 connect the metal Y address lines to any drain regions 13 which have at least one functioning transistor 10.

In operation, the X address selects one of the lines 14 or 15, or one of the other of the 256 such lines in a 64K ROM, and this selected line is held at logic 1 level or about +5 V. The remaining lines are held at Vss, logic 0. The Y address selects one of the 256 lines such as 18 and 19 and this line is connected via the Y decoder to the output. For dynamic ROMs, the Y lines usually would be precharged prior to an access cycle, so the selected line will conditionally discharge depending upon whether the selected bit at the intersection of the addressed X and Y lines is programmed a 1 or a 0.

The purpose of the moat programming is to change the response of some of the transistors 10 relative to the others, depending upon whether a 1 or a 0 is to be stored. A ROM cell can be either normally on or normally off when selected. The concept of this invention could be used in P-channel as well as N-channel ROMs. Depending on channel type and whether the cells are to be normally on or normally off when selected, the proper designation of logic 1 and logic 0 is defined. The normally on device can be either enhancement or depletion mode.

Figure 5:
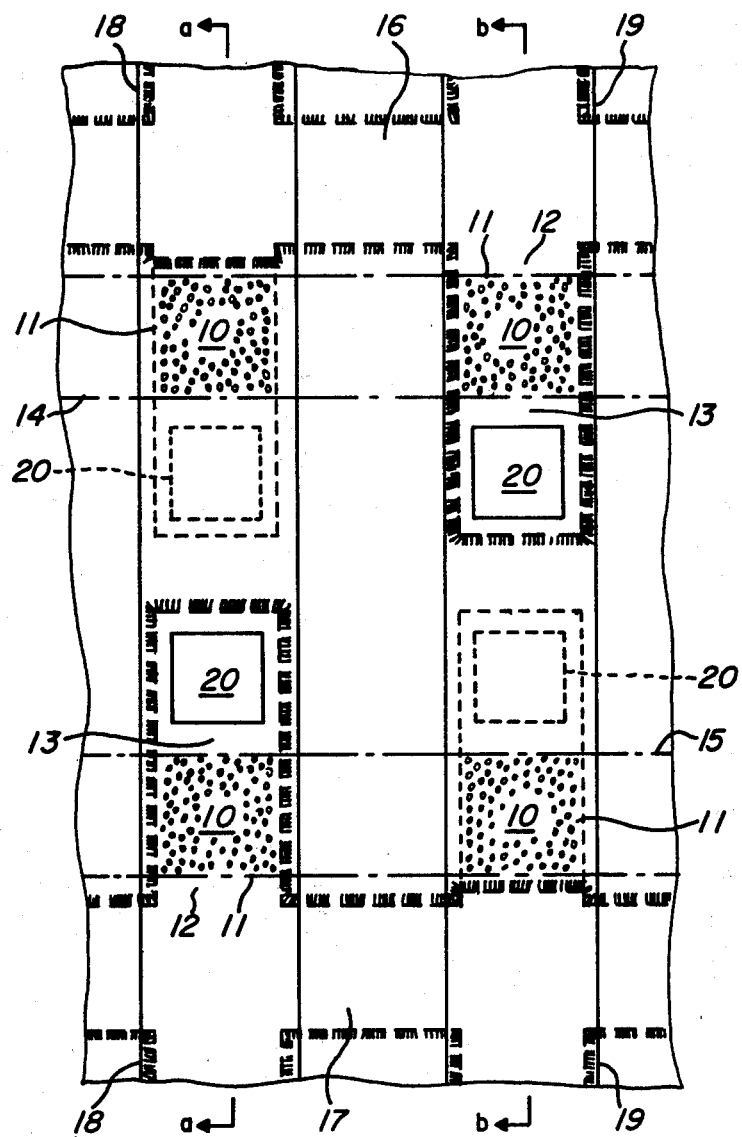
FIG. 5 is a plan view corresponding to FIG. 1 but made according to another embodiment of the invention.
Figure 6A:
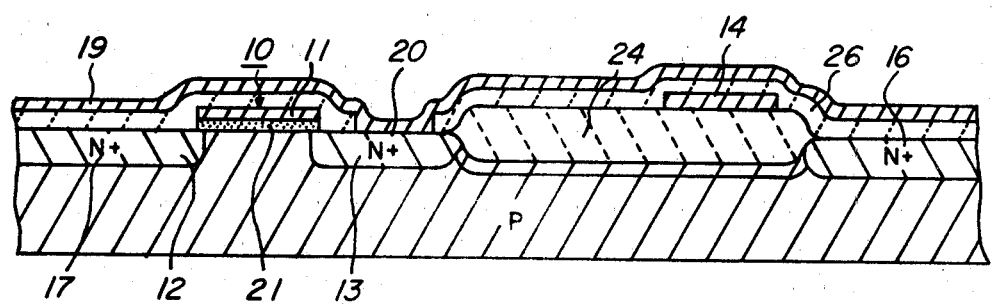
FIGS. 6a and 6b are elevation views in section of the cell of FIG. 5, taken along the lines a—a and b—b in FIG. 5.
Figure 6B:
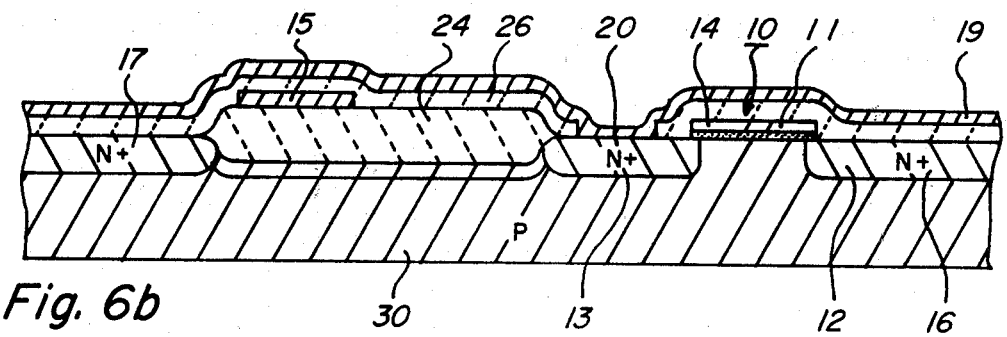

Referring to FIG. 5, the concept of the invention is applied to a ROM array which is basically contact programmed. The ROM array of FIG. 5 is the same as that of FIG. 1 except for the fact that separate drain areas 13 are provided for each of the transistors 10, and so a separate contact area 20 is employed for each cell. The advantage of contact programming instead of moat programming is that the unique mask is not introduced until late in the manufacturing sequence, so all of the slices are processed in bulk up to the point of patterning the multilevel oxide 26 to create the contact areas 20; this reduces the manufacturing time from receipt of an order for a unique code to delivery of parts, and also reduces cost. This is at the expense of a large cell size because the contact area 20 is not shared as it is in FIG. 1. For large production volume of a single part, exceeding 100,000 parts, for example, the manufacturing time becomes less important as delivery would be spread over many months. In such a case, it would be advantageous to add the second level of programming according to the invention, and moat program the thick oxide under the gates 11 of transistors selected to be inactive, as well as eliminate the drain 13. This reduces the capacitance of both the input X address and the output Y lines to Vss.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. In a method of making a read-only-memory including the steps of forming a plurality of pairs of insulated gate field effect transistors in a face of a semiconductor body, each of the transistors forming a memory cell and having a source, a drain and a silicon gate, the transistors being in a regular pattern of cell pairs to provide an array of memory cells, the cells of the array being programmed to store logic "1's" and "0's" by the presence of a thin gate insulator beneath said gate or by the presence of a thick insulating coating, two adjacent transistors in each cell pair being connected to a conductive output strip by a common contact area, the improvement comprising programming the array of memory cells by masking the formation of said thick insulating coating beneath the gates of selected ones of the field effect transistors and also patterning said common contact areas so that no such common contact is made for adjacent cell pairs which are both programmed for the same condition and have thick insulating coating beneath the gates of both transistors.

2. A method according to claim 1, wherein the field effect transistors and N-channel silicon gate transistors, and the conductive output strips are formed by metal deposited uniformly in a thin film and patterned.

3. A method according to claim 2 wherein the semiconductor body is P-type silicon, and the sources and drains are N-type.

4. A method of making a semiconductor device comprising the steps of forming a plurality of circuit elements in a regular pattern on a face of a semiconductor body, each of the circuit elements having control electrodes at the face and conductive interconnection strips overlaying the electrodes; and programming the characteristics of the circuit elements by selectively forming thick insulating coating beneath control electrodes of selected ones of the circuit elements using a mask and forming thin insulation coating beneath the control electrodes of remaining ones of the circuit elements, and programming contacts from the conductive interconnection to the face of the body for said remaining ones of the circuit elements while omitting such contacts for the selected ones of the circuit elements.

5. A method according to claim 4 wherein the cells in the array are formed with adjacent pairs of circuit elements having a common electrode in the face and a single contact is made from the conductive interconnection to the common electrode for an adjacent pair.

6. A method according to claim 5 wherein the semiconductor device is a memory array and the circuit elements are field effect transistors.

7. A method according to claim 6 wherein the field effect transistors are N-channel silicon transistors and the common electrodes are N+ regions forming drain electrodes.

8. A read only memory array comprising: a plurality of memory cells formed at a face of a silicon body in an array of rows and columns; each memory cell including an insulated gate field effect transistor having a source, a drain and a gate, the gate being insulated from the silicon by a thin gate insulator; the transistors being surrounded on said face by a thick field oxide coating; interconnections to the drains formed by metal strips overlying the gates but insulated therefrom, the metal strips contacting the drains for only selected ones of the cells, and a thick field oxide coating underlying the gate for selected ones of the memory cells to alter substantially the operation of the transistors of such cells compared to the transistors of memory cells other than the selected ones.

9. An array according to claim 8 wherein the adjacent cell pairs share a common drain region and contact to the common drain region is omitted for cell pairs in which both transistors have thick oxide beneath the gate.

10. An array according to claim 8 wherein the transistors are N-channel silicon gate transistors.

* * * * *